(12) United States Patent
Huang et al.

(10) Patent No.: US 10,115,686 B2
(45) Date of Patent: Oct. 30, 2018

(54) SEMICONDUCTOR STRUCTURE AND FABRICATING METHOD THEREOF

(71) Applicant: TAIWAN SEMICONDUCTOR MANUFACTURING COMPANY LTD., Hsinchu (TW)

(72) Inventors: Wei-Li Huang, Pingtung County (TW);
Jheng-Jie Wong, Tainan (TW);
Hsiang-Sheng Su, Tainan (TW);
Tsung-Lung Huang, Tainan (TW);
Kuo-Chio Liu, Hsinchu (TW);
Hsin-Chieh Huang, Hsin-Chu (TW);
De-Dui Marvin Liao, Hsin-Chu (TW);
Chin-Yu Ku, Hsinchu (TW);
Chen-Shien Chen, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/342,838

(22) Filed: Nov. 3, 2016

(65) Prior Publication Data
US 2017/0278809 A1 Sep. 28, 2017

Related U.S. Application Data

(60) Provisional application No. 62/313,561, filed on Mar. 25, 2016.

(51) Int. Cl.
*H01L 23/00* (2006.01)
*H01L 21/02* (2006.01)

(52) U.S. Cl.
CPC ........ *H01L 24/02* (2013.01); *H01L 21/02334* (2013.01); *H01L 24/03* (2013.01); *H01L 24/05* (2013.01); *H01L 24/42* (2013.01); *H01L 2224/0236* (2013.01); *H01L 2224/0239* (2013.01); *H01L 2224/02235* (2013.01); *H01L 2224/02251* (2013.01); *H01L 2224/02255* (2013.01); *H01L 2224/02311* (2013.01); *H01L 2224/02313* (2013.01); *H01L 2224/0381* (2013.01); *H01L 2224/0401* (2013.01);
(Continued)

(58) Field of Classification Search
CPC ............... H01L 24/02; H01L 21/02334; H01L 2224/02311; H01L 2224/0239; H01L 2224/0381; H01L 2224/0401; H01L 2924/01022; H01L 2924/01029; H01L 2224/02313; H01L 2224/02255; H01L 2224/02251; H01L 2224/022
USPC ........................................................ 257/739
See application file for complete search history.

(56) References Cited

U.S. PATENT DOCUMENTS 7,838,424 B2 11/2010 Karta et al.
7,863,742 B2 1/2011 Yu et al.
(Continued)

Primary Examiner — Fernando L Toledo
Assistant Examiner — Adam S Bowen
(74) Attorney, Agent, or Firm — WPAT, P.C., Intellectual Property Attorneys; Anthony King

(57) ABSTRACT

A method of fabricating a semiconductor structure includes: forming a conductive layer on a first insulating layer; etching a portion of the conductive layer to expose a portion of the first insulating layer; deforming a surface of the portion of the first insulating layer to form a rough surface of the first insulating layer; and removing a residue of the conductive layer on the rough surface of the first insulating layer.

20 Claims, 16 Drawing Sheets

(52) U.S. Cl.
    CPC ............... *H01L 2924/01022* (2013.01); *H01L 2924/01029* (2013.01); *H01L 2924/0132* (2013.01)

(56) References Cited

U.S. PATENT DOCUMENTS

| | | |
|---|---|---|
| 7,932,601 B2 | 4/2011 | Chang et al. |
| 8,754,508 B2 | 6/2014 | Chen et al. |
| 8,772,151 B2 | 7/2014 | Chen |
| 8,846,548 B2 | 9/2014 | Tu et al. |
| 9,253,897 B2 * | 2/2016 | Kaneko ................ H05K 3/4007 |
| 2010/0193950 A1 * | 8/2010 | Lee ....................... H01L 23/295 |
| | | 257/738 |
| 2013/0341800 A1 | 12/2013 | Tu et al. |
| 2014/0015122 A1 | 1/2014 | Chou et al. |
| 2014/0045379 A1 | 2/2014 | Chen |
| 2014/0048926 A1 | 2/2014 | Wang et al. |
| 2014/0077356 A1 | 3/2014 | Chen et al. |
| 2014/0183693 A1 | 7/2014 | Tsai et al. |
| 2014/0187103 A1 | 7/2014 | Chen et al. |
| 2014/0252558 A1 | 9/2014 | Yu et al. |
| 2014/0252597 A1 | 9/2014 | Tsai et al. |
| 2014/0252601 A1 | 9/2014 | Lu et al. |
| 2014/0252608 A1 | 9/2014 | Chen et al. |
| 2014/0262468 A1 | 9/2014 | Chen et al. |
| 2014/0264885 A1 | 9/2014 | Tsai et al. |

\* cited by examiner

SEMICONDUCTOR STRUCTURE AND FABRICATING METHOD THEREOF

CROSS-REFERENCE TO RELATED APPLICATION

This application claims the benefit of U.S. Provisional Application No. 62/313,561, filed Mar. 25, 2016.

BACKGROUND

Presently, electronic equipment is essential for many modern applications. Therefore, consumers are increasingly demanding more processing power, lower electrical power usage and cheaper devices. As the electronic industry strives to meet these demands and more complicated and denser configurations, miniaturization will result in an extension of the number of chips per wafer and the number of transistors per chip, as well as a reduction in power usage. Wafer level packaging (WLP) technology has been gaining popularity since the electronic components are being designed to be lighter, smaller, more multifunctional, more powerful, more reliable and less expensive. The WLP technology combines dies having different functionalities at a wafer level, and is widely applied in order to meet continuous demands toward the miniaturization and higher functions of the electronic components.

Generally, a semiconductor die may be connected to other devices external to the semiconductor die through a type of packaging utilizing solder bumps. The solder bumps may be formed by initially forming a layer of underbump metallization on the semiconductor die and then placing solder onto the underbump metallization. After the solder has been placed, a reflow operation may be performed in order to shape the solder into the desired bump shape. The solder bump may then be placed into physical contact with the external device and another reflow operation may be performed in order to bond the solder bump with the external device. In such a fashion, a physical and electrical connection may be made between the semiconductor die and an external device, such as a printed circuit board, another semiconductor die, or the like. Some factors, such as delamination and corrosion issue during the fabrication process, may affect the quality of bump connections. Since the bump connections in the WLP technology is poorly controlled, improvements in the method for a WLP continue to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
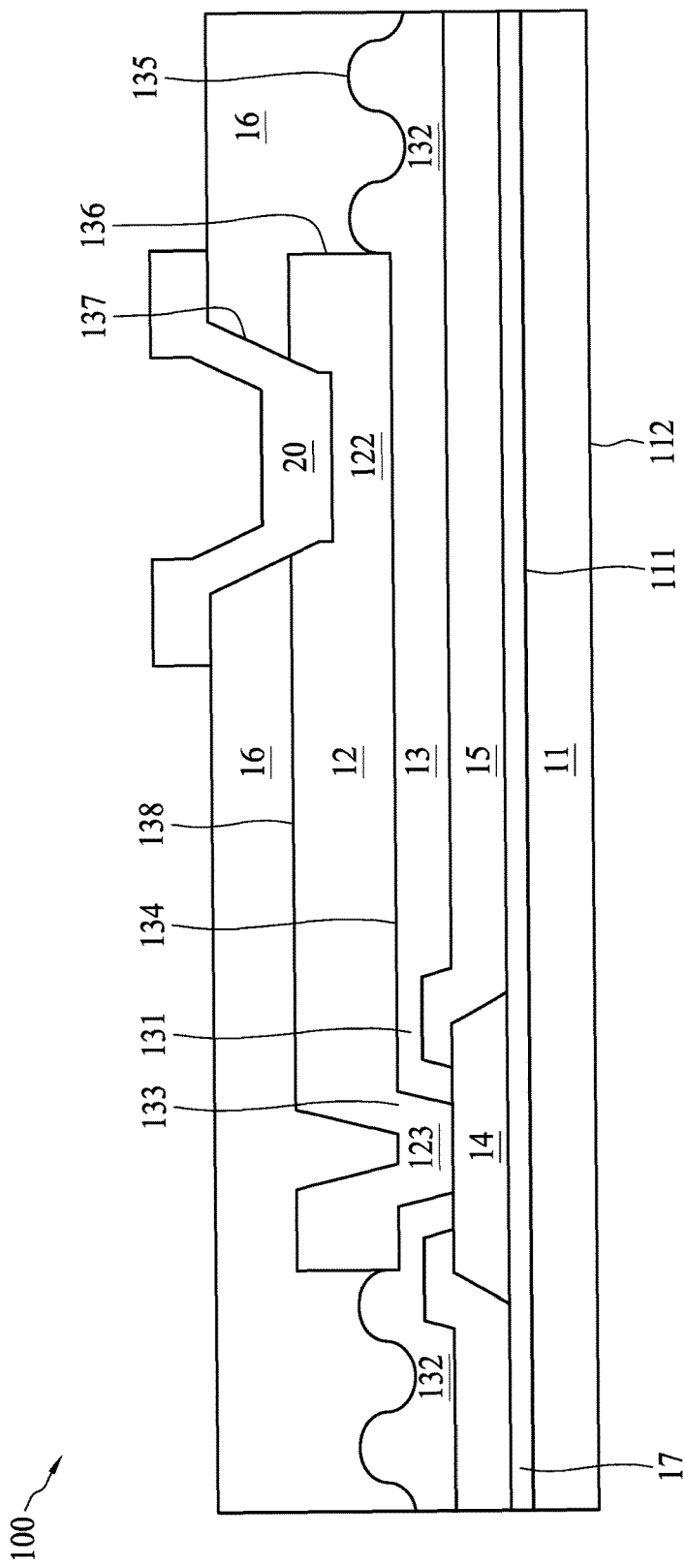
FIG. 1 is a cross-sectional view of a semiconductor structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

As used herein, a "substrate" refers to a bulk substrate on which various layers and device structure are formed. In some embodiments, the bulk substrate includes silicon or a compound semiconductor, such as GaAs, InP, Si/Ge, or SiC. Examples of the layers include dielectric layers, doped layers, polysilicon layers or conductive layers. Examples of the device structures include transistors, resistors, and/or capacitors, which may be interconnected through an interconnect layer to additionally integrated circuits. In some embodiments, the bulk substrate includes a wafer such as a polished wafer, an epi wafer, an argon anneal wafer, and a silicon on insulator (SOI) wafer.

As used herein, "deposition" refers to operations of depositing materials on a substrate using a vapor phase of a material to be deposited, a precursor of the material, an electrochemical reaction, or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using electrochemical reaction include electroplating, electro-less plating, and the like. Other examples of deposition include pulse laser deposition (PLD), and atomic layer deposition (ALD).

As used herein, a "mask layer" recited in the present disclosure is an object of a patterning operation. The patterning operation includes various steps and operations and varies in accordance with features of embodiments. In some embodiments, a patterning operation patterns an existing film or layer. The patterning operation includes forming a mask on the existing film or layer and removing the unmasked portion of the film or layer with an etch or other removal operations. The mask layer is a photo resist or a hardmask. In some embodiments, a patterning operation directly forms a patterned layer on a surface. The patterning operation includes forming a photosensitive film on the surface, conducting a photolithography operation and a developing operation. The remaining photosensitive film may be removed or retained and integrated into the package.

An underbump metallization (UBM) is used for receiving a conductive bump. A redistribution layer (RDL) electrically couples to the underbump metallization and extends to a metal pad. The metal pad electrically couples to a semiconductor die. The underbump metallization and the redistribution layer are placed onto a stack of many different materials, such as dielectric materials, metallization materials, etch stop materials, barrier layer materials, and other materials utilized in the formation of the semiconductor device. Each one of these different materials may have a unique coefficient of thermal expansion that is different from the other materials. This type of coefficient of thermal expansion mismatch causes each one of the materials to expand a different distance when the semiconductor device is heated during later processing or use. As such, at elevated temperatures there is a coefficient of thermal expansion mismatch that causes stresses to form between the different materials and, hence, the different parts of the semiconductor device. This mismatch is especially prevalent between the underbump metallization and underlying layers. If not controlled, these stresses can cause delamination to occur between the various layers of material, especially when the materials used include copper-titanium alloy and a low-k dielectric layer. This delamination can damage or even destroy the semiconductor device during the manufacturing process or else during its intended use.

In the present disclosure, a polymer/polybenzoxazole (PBO) surface treatment is provided to reduce the leakage of the redistribution layer during the fabrication process for solving the delamination and corrosion issue. FIG. 1 is a cross-sectional view of a semiconductor structure 100 in accordance with some embodiments. The semiconductor structure 100 includes a semiconductive substrate 11, a redistribution layer (RDL) 12, a first insulating layer 13, a metal pad 14, a passivation layer 15, a second insulating layer 16, an active region 17, and an underbump metallization (UBM) 20. A metal bump (now shown) is formed on the underbump metallization 20. A surface 111 is the frontside surface of the semiconductive substrate 11 and is opposite to a backside surface 112 of the semiconductive substrate 11. In some embodiments, the semiconductive substrate 11 is, for example, bulk silicon, doped silicon or undoped silicon. In certain embodiments, the surface 112 is processed in subsequent back-end manufacturing operations such as backside thinning.

In some embodiments, the active region 17 includes interconnections, interlayer dielectric, and/or intermetal dielectric. In some embodiments, the active region 17 is fabricated to become integrated circuits (IC) in subsequent manufacturing operations.

In some embodiments, the metal pad 14 is formed on the active region 17 and over the surface 111 of the semiconductive substrate 11. The metal pad 14 includes aluminum, copper, silver, gold, nickel, tungsten, alloys thereof, and/or multi-layers thereof. The metal pad 14 is electrically coupled to the active region 17, for example, through underlying conductive traces or features.

Passivation layer 15 is formed on the metal pad 14. In certain embodiments, the passivation layer 15 is formed of dielectric materials such as silicon oxide, silicon nitride, or multi-layers thereof. The first insulating layer 13 is over the passivation layer 15 and covers a portion of the metal pad 14. Both the passivation 15 and the first insulating layer 13 are patterned in order to have a recess to expose a portion of the metal pad 14. The exposed metal pad 14 serves as an electrical contact between the active region 17 and other conductive trace external to the active region 17, for example, the redistribution layer 12. In some embodiments, the first insulating layer 13 may be a polymer layer or a dielectric layer. The first insulating layer 13 may be formed of a polymeric material such as epoxy, polyimide, benzocyclobutene (BCB), polybenzoxazole (PBO), and the like.

The redistribution layer 12 includes a first portion 122 on the first insulating layer 13 and a second portion 123 extending into the recess of the passivation layer 15 and the first insulating layer 13. The second portion 123 of the redistribution layer 12 may line the bottom and sidewalls of the recess and electrically couple to the metal pad 14. The redistribution layer 12 may include conductive material such as gold, silver, copper, nickel, tungsten, aluminum, and/or alloys thereof.

In some embodiments, the first portion 122 of the redistribution layer 12 is located at one terminal of the redistribution layer 12 and acts as a landing area for receiving the metal bump (not shown).

The second insulating layer 16 disposes on the redistribution layer 12 and the first insulating layer 13. The second insulating layer 16 is configured to partially surround the underbump metallization 20. One benefit to introduce the second insulating layer 16 is to provide protection for the redistribution layer 12 so as to isolate moisture and environmental disturbance from the redistribution layer 12. Another benefit is to secure the underbump metallization 20 at a predetermined position, for example the landing area 122 of the redistribution layer 12, to prevent the underbump metallization 20 from dislocating under an undesired pulling force. In some embodiments, the second insulating layer 16 may be a polymer layer or a dielectric layer, and can include a single layer film or a composite stack. When the second insulating layer 16 is a polymer layer, the polymer layer may be a molding compound including various materials, for example, one or more of epoxy resins, phenolic hardeners, silicas, catalysts, pigments, mold release agents, and the like. Each of the materials for forming the molding compound has a high thermal conductivity, a low moisture absorption rate, a high flexural strength at board-mounting temperatures, or a combination thereof.

The first insulating layer 13 and the second insulating layer 16 may be the same or different type of insulating layer. According to some embodiments, the first insulating layer 13 comprises two portions, i.e. the first portion 131 and the second portion 132. The first portion 131 is configured to have an opening 133 for exposing the metal pad 14. The first portion 131 has a first surface 134. The redistribution layer 12 is disposed on the first surface 134 of the first portion 131 and the exposed metal pad 14. The second portion 132 has a second surface 135. The second surface 135 of the second portion 132 is not disposed by the redistribution layer 12. The second surface 135 is disposed by the second insulating layer 16. The first surface 134 and the second surface 135 of the first insulating layer 13 have different roughness. According to some embodiments, the first surface 134 is configured to be a relatively flat surface and the second surface 135 is configured to be a relatively large roughness surface as shown in FIG. 1. Therefore, the second surface 135 is rougher than the first surface 134. When the second surface 135 is rougher than the first surface 134, the adhesion of the interface between the second insulating layer 16 and the first insulating layer 13 is better than the counterpart where the second surface 135 is a flat surface. According to some embodiments, the roughness of the second surface 135 may be 8~15 nm. The roughness of the surface 138 of the redistribution layer 12 may be 25~40 um. In some embodiments, the roughness of surface is measured based on an atomic force microscope (AFM). The measurement condition of X-ray photoelectron spectroscopy may be: a) the X-ray source of Al Kα is 1450~1500 eV, b) the pressure of ultra-high vacuum is 5E-10 mbar, c) the beam spot size is 10 um~400 um, d) the binding energy range is 0~1486 eV, and e) the energy solution is 0.1 eV. The measurement condition of the atomic force microscope may be: a) the scan area is 5 um*5 um, b) the scan velocity is 5 um/s, c) the sample per line is 512 points, d) the line is 100, e) the drive amplitude is 0.35V~0.4V, and f) the drive frequency is 295 KHz.

According to some embodiments, a percentage of titanium on the second surface 135 of the conductive layer 12 is about 0.02%~about 0.20%. The second surface 135 may be a horizontal plane of the first insulating layer 13 having the same level with the bottom surface (i.e. 134) of the conductive layer 12. For example, when the material of the conductive layer is copper-titanium alloy, the percentage of the copper residue left on the second surface 135 of the first insulating layer 13 may be 0.5%~1.00%, 1.00%~1.50%, or 1.50%~2.00% while the percentage of the titanium residue left on the second surface 135 of the first insulating layer 13 may be 0.02%~0.07%, 0.07%~0.12%, 0.12%~0.17%, or 0.17%~0.20%. According to some embodiments, the percentage of the conductive residue left on the second surface 135 of the first insulating layer 13 may be analyzed by X-ray photoelectron spectroscopy (XPS) analyzer. The XPS analyzer may measure all of the different conductive materials left on the second surface 135 of the first insulating layer 13, and then calculate the percentage of the titanium residue left on the second surface 135 of the first insulating layer 13.

According to some embodiments, when the second insulating layer 16 is formed, the second insulating layer 16 adhere to the second surface 135 of the first insulating layer 12, the surface 136 of the redistribution layer 12, and the surface 137 of the underbump metallization 20. As the coefficient of thermal expansion of the first insulating layer 13 may different form the coefficient of thermal expansion of the second insulating layer 16, the first insulating layer 13 and the second insulating layer 16 may have different expansion distances when the semiconductor structure 100 is heated during the heating process. If the second surface 135 is a flat surface, the different expansion distances may delaminate the interface between the second insulating layer 16 and the umderbump metallization 20, the interface between the second insulating layer 16 and the redistribution layer 12, and the interface between the second insulating layer 16 and the first insulating layer 13. However, in the present embodiments, the second surface 135 of the first insulating layer 13 is a relatively large roughness surface. The rough surface is acted as a fastener to force the first insulating layer 13 and the second insulating layer 16 to have the same expansion distance when the semiconductor structure 100 is heated during the heating process. When the first insulating layer 13 and the second insulating layer 16 have the same expansion distance during the heating process, the interface between the second insulating layer 16 and the umderbump metallization 20, the interface between the second insulating layer 16 and the redistribution layer 12, and the interface between the second insulating layer 16 and the first insulating layer 13 may not be delaminated. In other words, the second insulating layer 16 still tightly adheres to the underbump metallization 20, the redistribution layer 12, and the first insulating layer 13 after the heating process. When the interface between the second insulating layer 16 and the underbump metallization 20, the interface between the second insulating layer 16 and the redistribution layer 12, and the interface between the second insulating layer 16 and the first insulating layer 13 are not delaminated, the moisture is prevented from reaching the redistribution layer 12. Therefore, the moisture incursion problem in the semiconductor structure 100 is solved.

Figure 2:
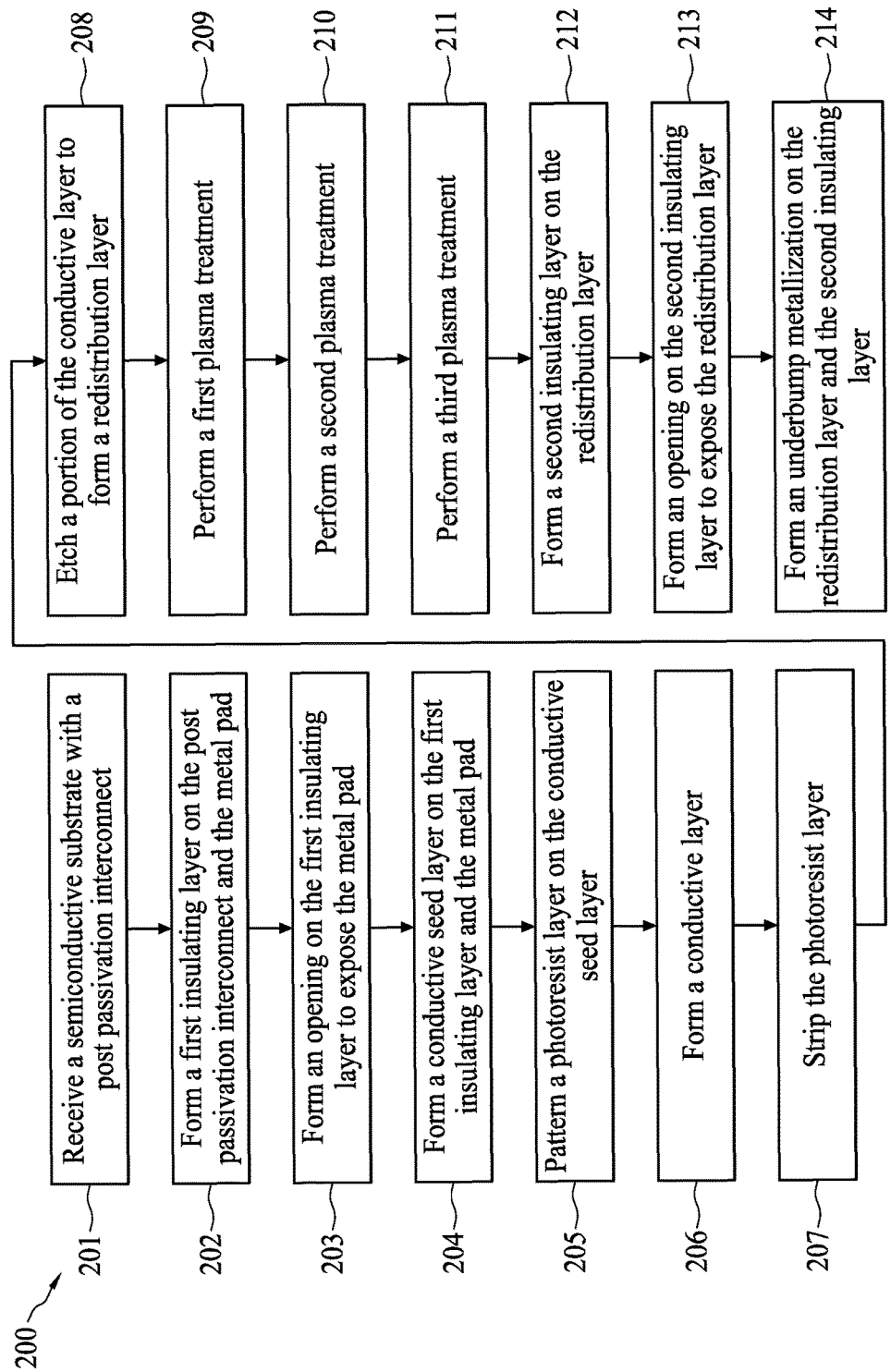
FIG. 2 is a flow diagram illustrating a method 200 of fabricating the semiconductor structure 100 in accordance with some embodiments.

FIG. 2 is a flow diagram illustrating a method 200 of fabricating the semiconductor structure 100 in accordance with some embodiments. The method 200 includes several operations, which are discussed in detail with reference to FIGS. 3 to 16. At operation 201, a semiconductive substrate with a post passivation interconnect is received, wherein the post passivation interconnect includes an opening for exposing a metal pad. At operation 202, a first insulating layer is formed on the post passivation interconnect and the metal pad. At operation 203, an opening is formed on the first insulating layer to expose the metal pad. At operation 204, a conductive seed layer is formed on the first insulating layer and the metal pad. At operation 205, a photoresist layer is patterned on the conductive seed layer. At operation 206, a conductive layer is formed. At operation 207, the photoresist layer is stripped. At operation 208, a portion of the conductive layer is etched to form a redistribution layer. At operation 209, a first plasma treatment is performed. At operation 210, a second plasma treatment is performed. At operation 211, a third plasma treatment is performed. At operation 212, a second insulating layer is formed on the redistribution layer. At operation 213, an opening is formed on the second insulating layer to expose the redistribution layer. At operation 214, an underbump metallization is formed on the redistribution layer and the second insulating layer. The term "received" is used in the present paragraph to describe an operation of locating an object to a specific site such as a chuck. The receiving operation includes various steps and processes and varies in accordance with the features of embodiments. In some embodiments, a receiving operation includes holding a semiconductor substrate or a wafer for further spinning motion. In certain embodiments, a receiving operation includes spinning a semiconductor substrate or a wafer in a vacuum condition.

FIGS. 3 to 16 have been simplified for a better understanding of the inventive concepts of the present disclosure.

Figure 3:
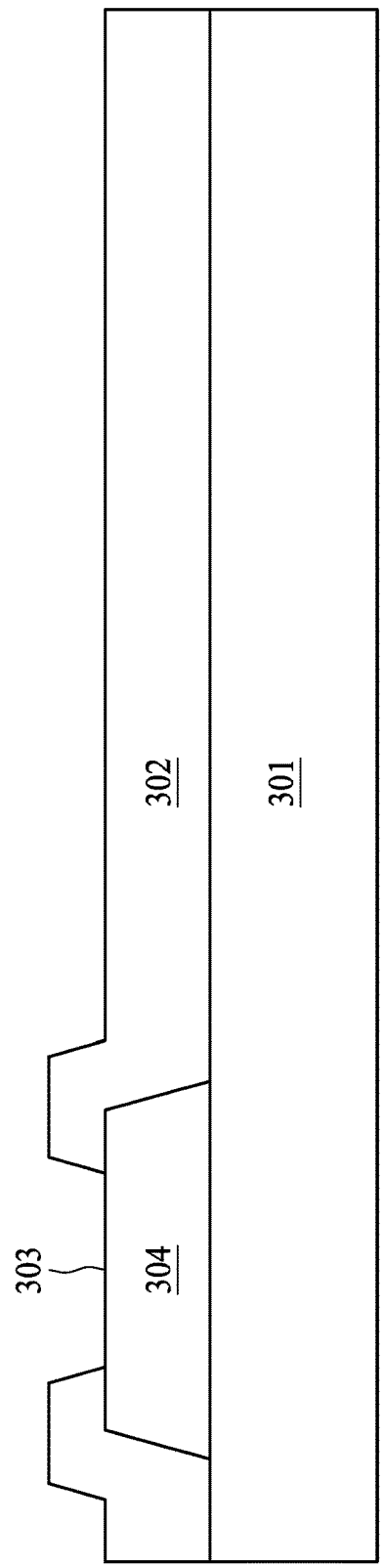
FIGS. 3 to 16 are cross-sectional views corresponding to various operations 201 to 214 in FIG. 4.
Figure 5:
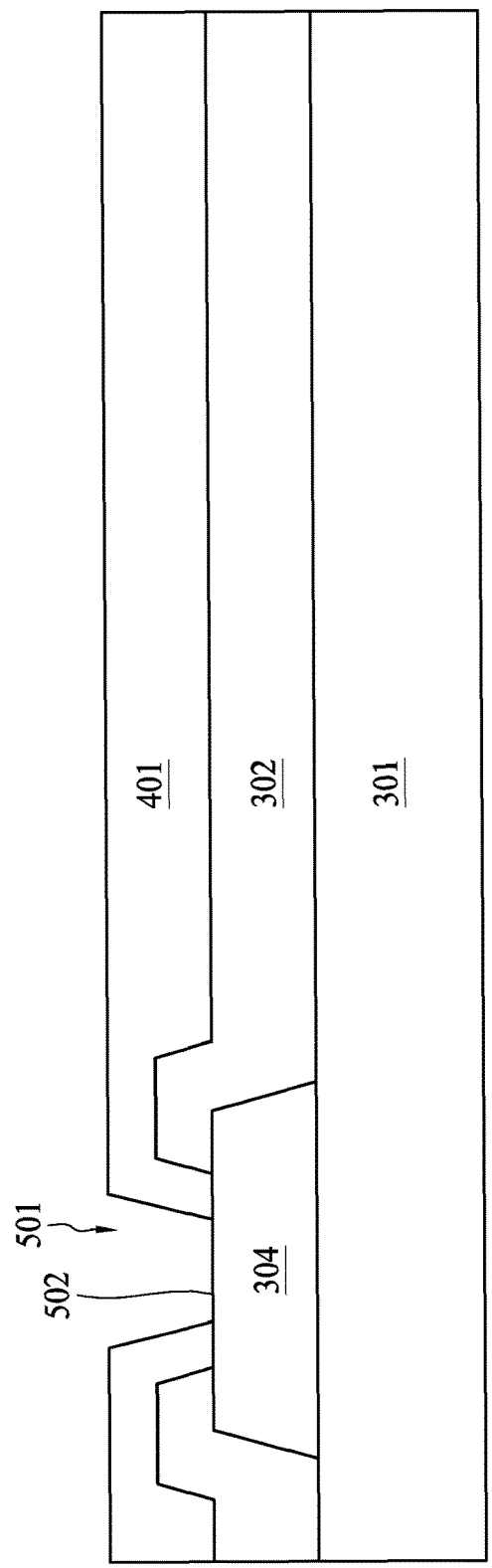

Referring to FIG. 2 and FIG. 3, in operation 201, the semiconductive substrate 301 is received. In some embodiments, the semiconductive substrate 301 is on a stage for several operations, such as mask pattern transferring operations. As shown in FIG. 5, passivation layer 302 is patterned to have an opening 303 for partially exposing the metal pad 304. In other embodiments, the passivation layer 302 is formed through any suitable techniques such as CVD. The active region (not shown) disposed in between the semiconductive substrate 301 and the passivation layer 302 is omitted here and the following operations for brevity.

Figure 4:
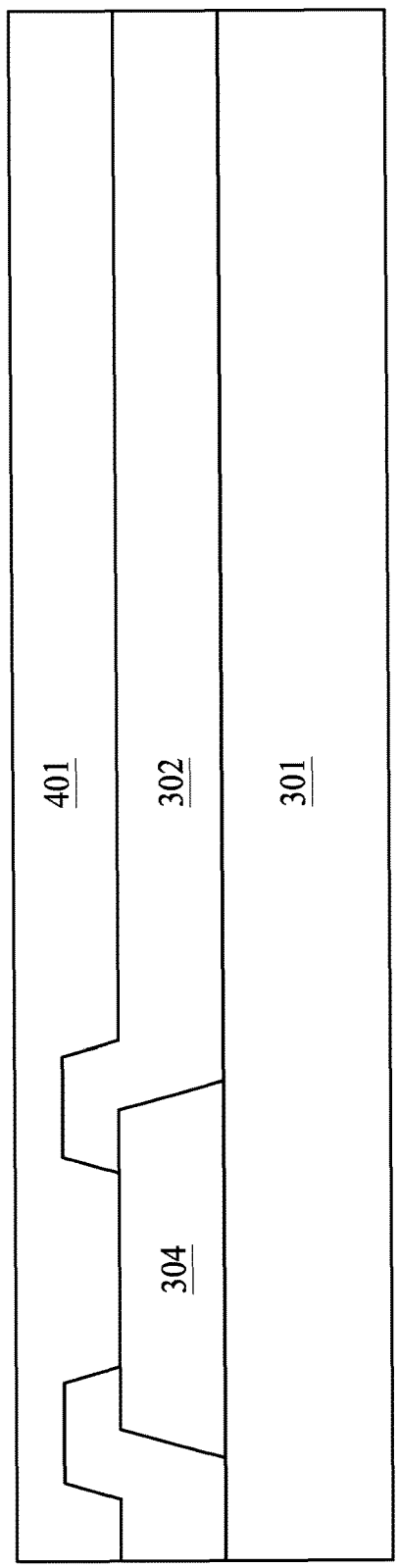

Referring to FIG. 2 and FIG. 4, in operation 202, a first insulating layer 401 is formed on the passivation layer 302 and the exposed portion of the metal pad 304. The first insulating layer 401 may be a polymer layer or a dielectric layer. The first insulating layer 401 is made by any suitable technique such as spin coating.

Referring to FIG. 2 and FIG. 5, in operation 203, the first insulating layer 401 is patterned to form an opening 501 to expose a surface 502 of a portion of the metal pad 304. In some embodiments, the first insulating layer 401 is a photo sensitive material such as polyimide, and a mask is used for transferring a pattern on the first insulating layer 401. A lithography operation is combined therewith to form the opening 501.

Figure 6:
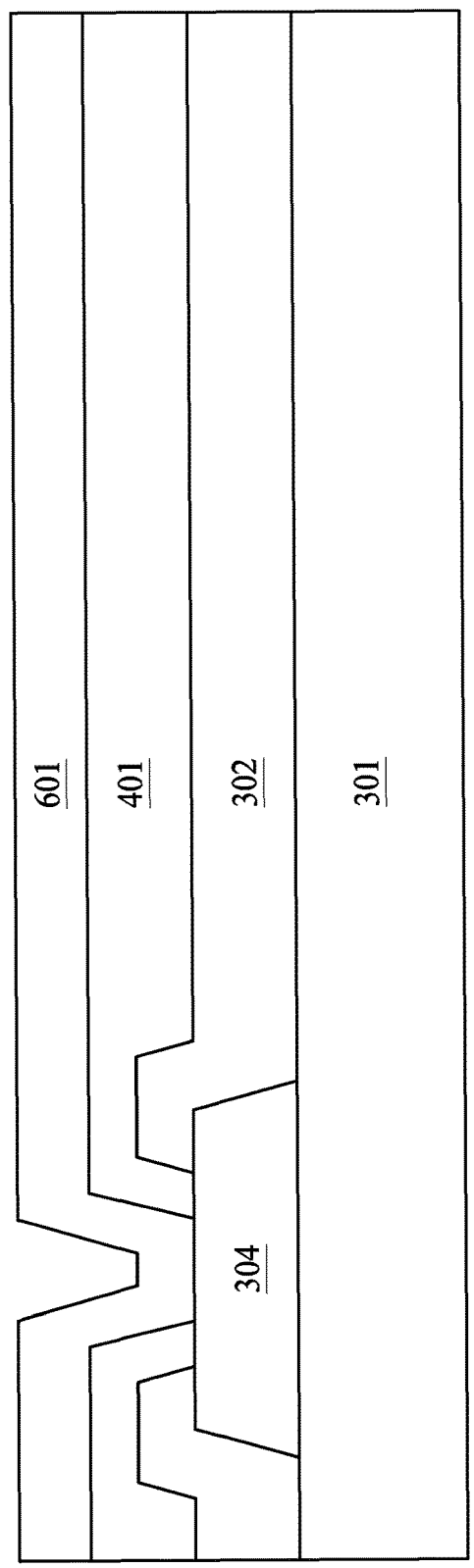

Referring to FIG. 2 and FIG. 6, in operation 204, a conductive seed layer 601 is formed on the first insulating layer 401 and the exposed portion of the metal pad 304. In some embodiments, the conductive seed layer 601 is made by a spattering deposition or any other suitable physical vapor deposition (PVD) method. The material of the target to form the conductive seed layer 601 may be copper, titanium, or copper-titanium alloy.

Figure 7:
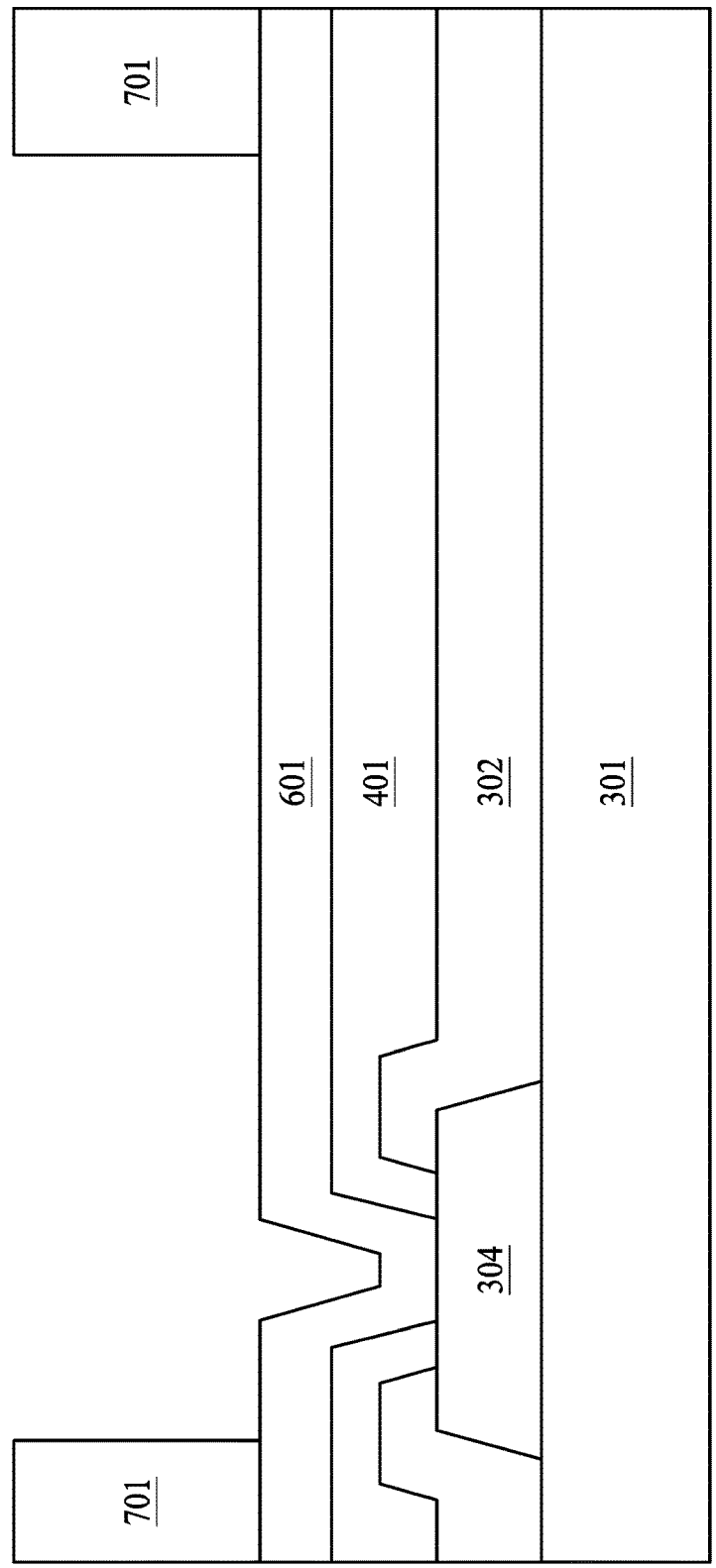

Referring to FIG. 2 and FIG. 7, in operation 205, a photoresist layer 701 is patterned on the conductive seed layer 601. The area not covered by the photoresist layer 701 is the redistribution layer of the semiconductor structure 100.

Figure 8:
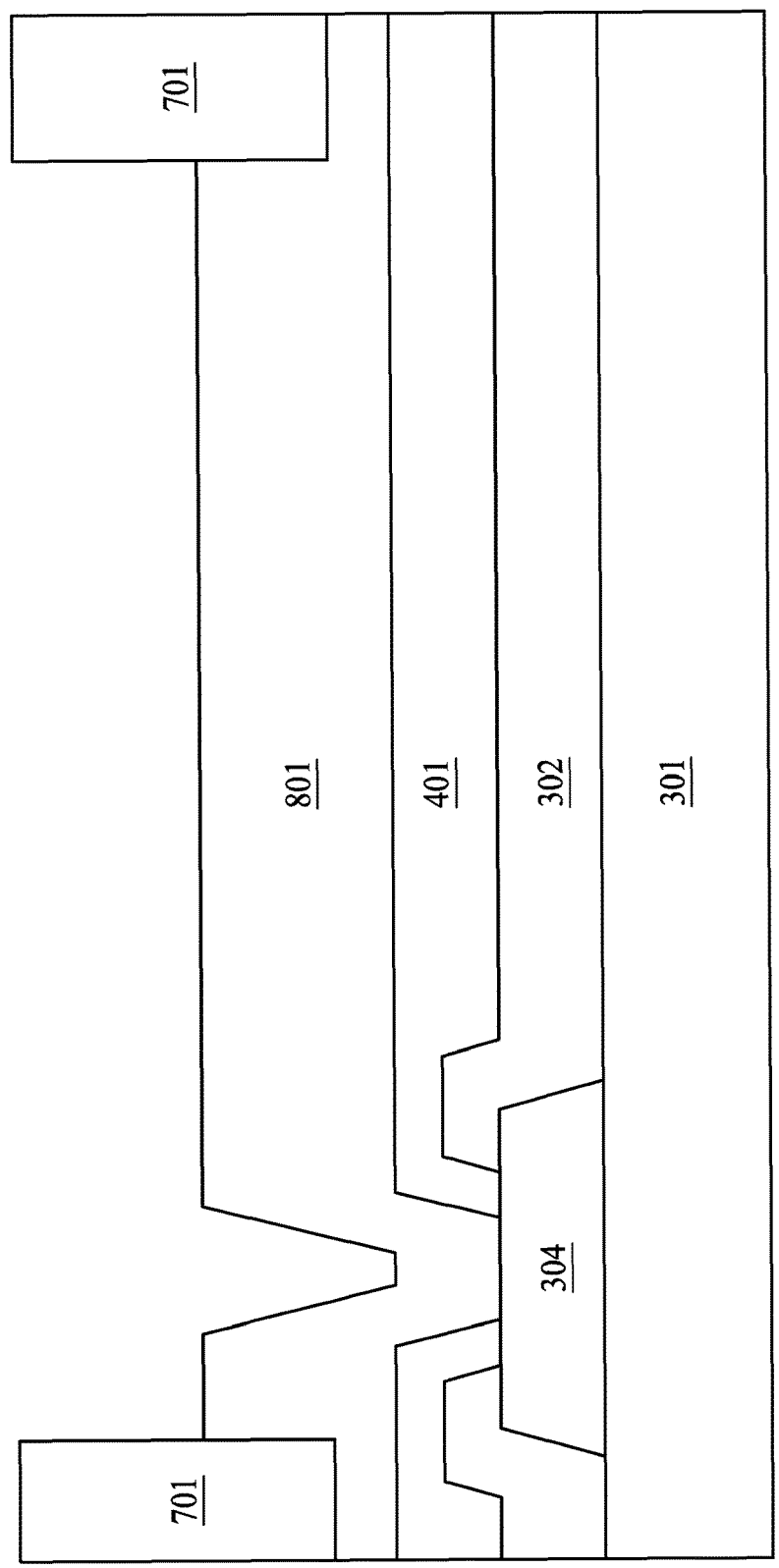

Referring to FIG. 2 and FIG. 8, in operation 206, an electroplating process is performed to grow the conductive seed layer 601 other than the area covered by the photoresist layer 701 to form a conductive layer 801. The material of the conductive layer 801 may be copper, titanium, or copper-titanium alloy.

Figure 9:
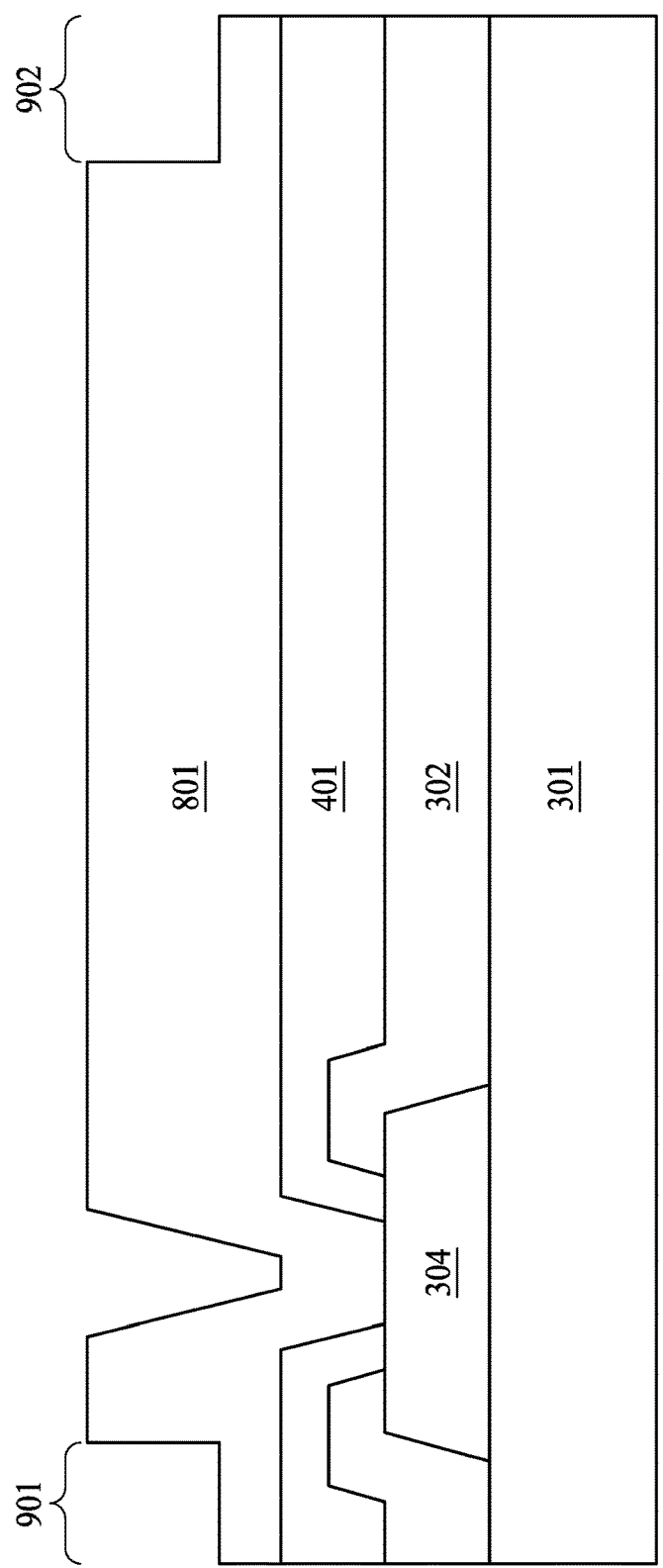

Referring to FIG. 2 and FIG. 9, in operation 207, the photoresist layer 701 is stripped. According to some embodiments, the photoresist layer 701 is removed through an appropriate etchant. A dry etching method or a wet etching method may be adopted to remove the photoresist layer 701. In some embodiments, oxygen plasma may be employed in the dry etching method to oxidize the photoresist layer 701, while an organic solution or any other acid solution may be utilized in the wet etching method to remove the photoresist layer 701. After the operation 207, the portions 901 and 902 covered by the photoresist layer are exposed.

Figure 10:
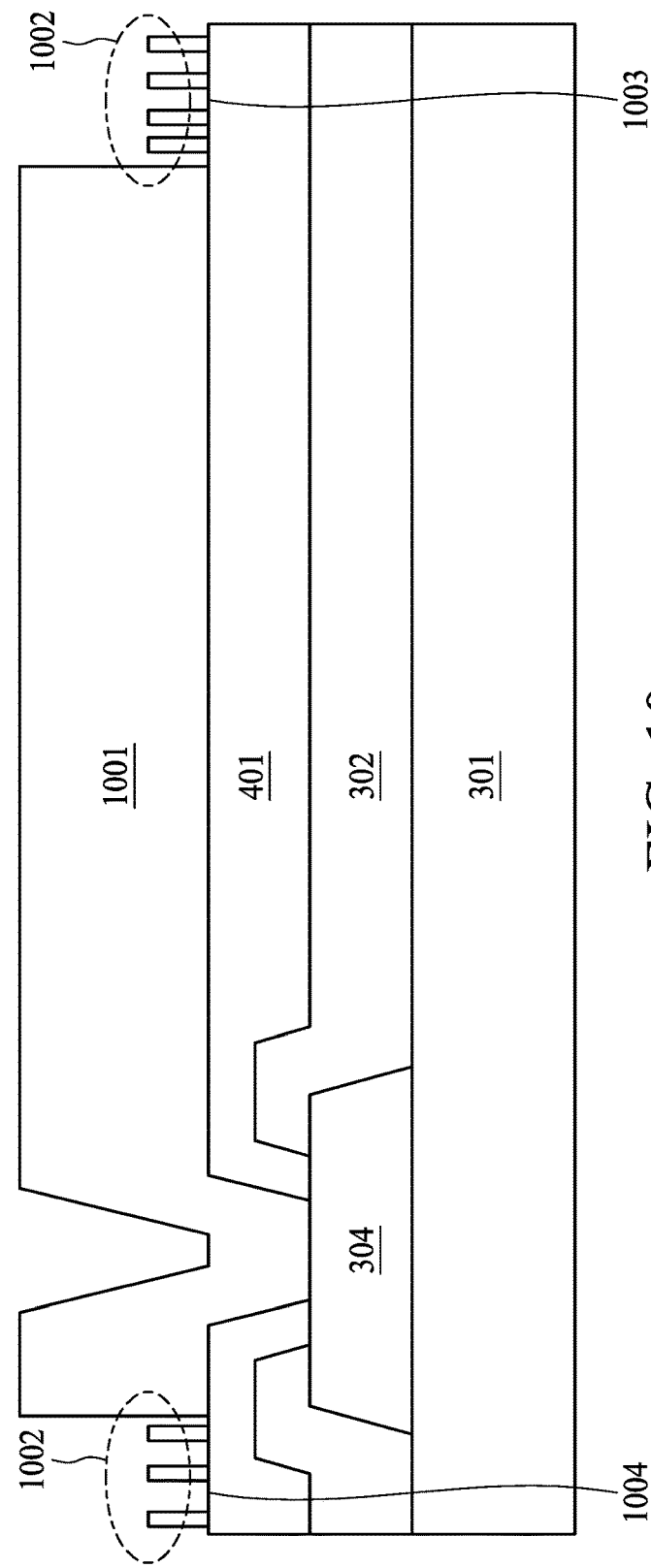

Referring to FIG. 2 and FIG. 10, in operation 208, the unwanted portions 901 and 902 of the conductive layer 801 are etched to form the redistribution layer 1001. The etching operation may be implemented by using suitable techniques such as a wet etching operation or a laser ablation operation. According to some embodiments, a mask (not shown) protects the wanted portion of the conductive layer 801, and appropriate etchant is adopted to carve the unprotected portions 901, 902 of the conductive layer 801 so as to form the redistribution layer 1001. As the conductive material in portions 901 and 902 may not be perfectly removed by the etching operation, some conductive residue 1002 may be left on the surfaces 1003 and 1004, which correspond to the location of the portions 901 and 902, of the first insulating layer 401. The conductive residue 1002 should be removed before the later heating process because the conductive residue 1002 may cause delamination and corrosion issue during the heating process. The material of the conductive residue 1002 may be copper, titanium, or copper-titanium alloy.

Figure 11:
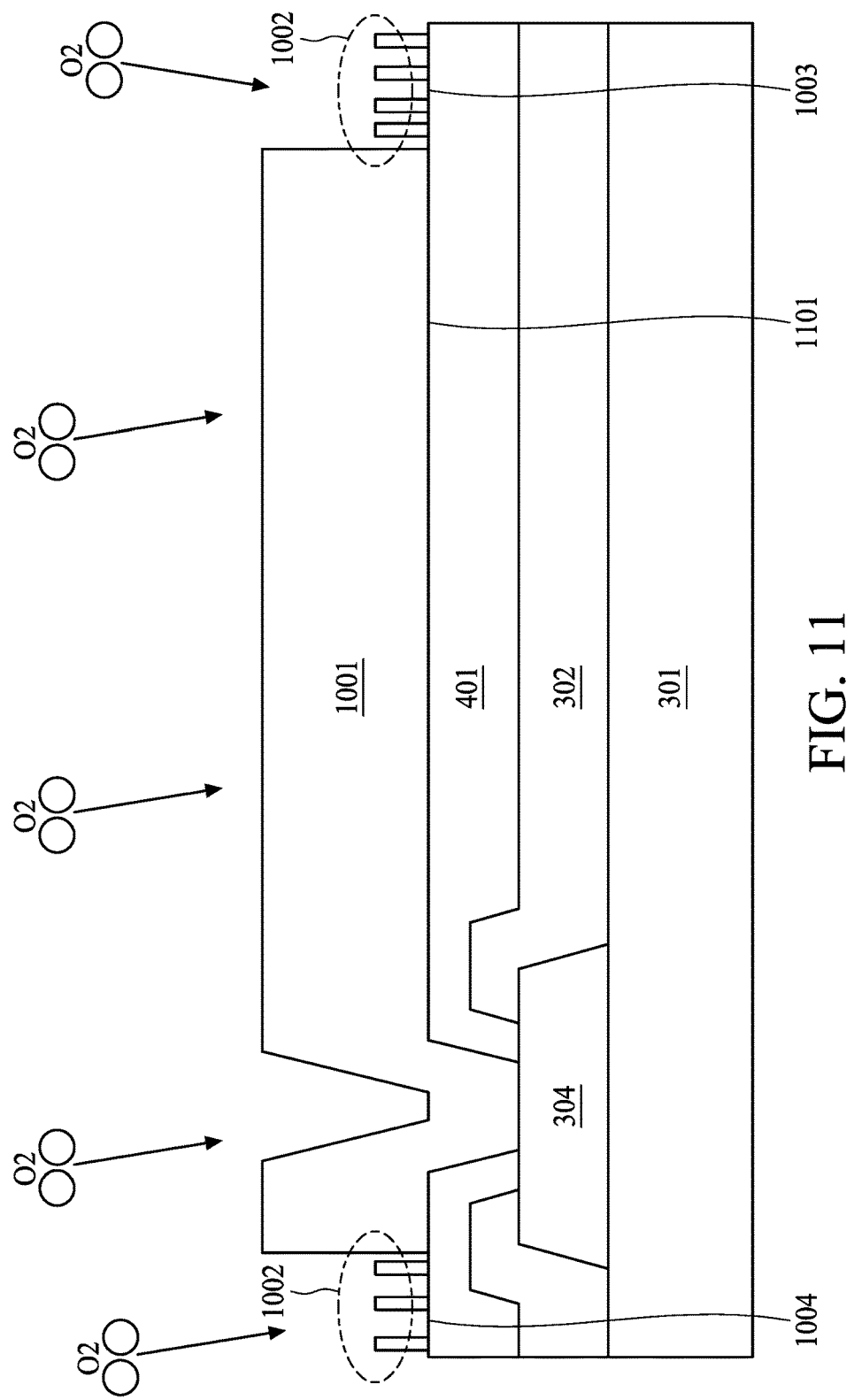

Referring to FIG. 2 and FIG. 11, in operation 209, the first plasma treatment is performed upon the first insulating layer 401 and the redistribution layer 1001. The first plasma treatment is designed to have a first reactive or etching rate to process the first insulating layer 401. The first reactive rate may be depended on the concentration of plasma used in the first plasma treatment, the temperature during the first plasma treatment, or a combination of the above conditions. According to some embodiments, the first plasma treatment is an oxidation process by using oxygen (O2) gas or plasma. The oxygen is arranged to process or burn the first insulating layer 401 to deform the surfaces 1003 and 1004 of the first insulating layer 401. The surfaces of the processed portions, i.e. the surfaces 1003 and 1004, become relatively large roughness (i.e. the rough portions 1202 and 1203 in FIG. 12) after the oxygen surface treatment. According to some embodiments, the redistribution layer 1001 is not reacted to the oxygen. Moreover, the oxygen does not reach the surface 1101 of the first insulating layer 401 that is covered by the redistribution layer 1001. Therefore, the surface 1101 covered by the redistribution layer 1001 can be kept relatively flat after the oxygen surface treatment. According to some embodiments, the oxygen may remove some of the conductive residue 1002 during the oxygen surface treatment.

Figure 12:
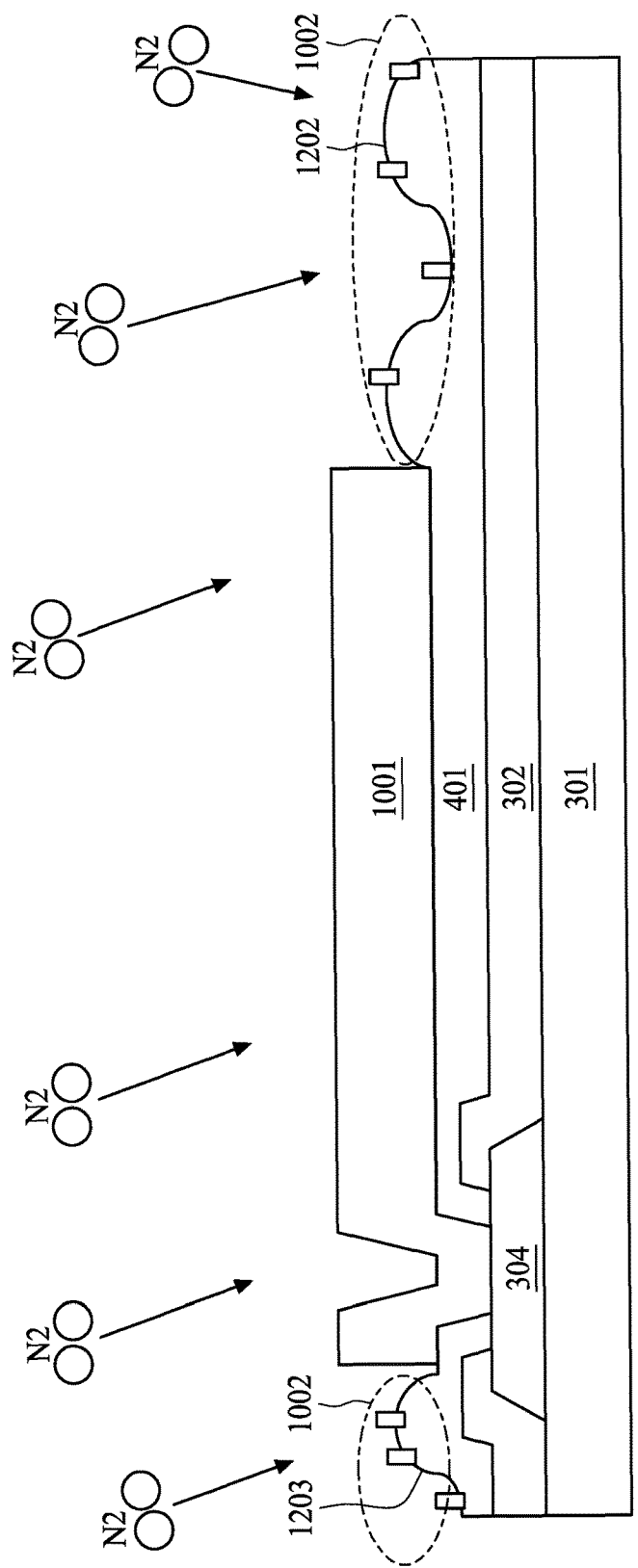

Referring to FIG. 2 and FIG. 12, in operation 210, the second plasma treatment is performed upon the first insulating layer 401 and the redistribution layer 1001. The second plasma treatment is performed following the first plasma treatment. The second plasma treatment is designed to have a second reactive rate to process the first insulating layer 401. The second reacitve rate may be depended on the concentration of plasma used in the second plasma treatment, the temperature during the second plasma treatment, or a combination of the above conditions. According to some embodiments, the second plasma treatment is a surface treatment by using nitrogen (N2) gas or plasma. The nitrogen is arranged to react with the conductive residue 1002 on the rough surfaces 1202 and 1203 of the first insulating layer 401 for removing the conductive residue 1002 from the first insulating layer 401. Therefore, the second reactive rate of the second plasma treatment may be larger than the first reactive rate of the first plasma treatment. According to some embodiments, when the relatively flat surfaces 1003 and 1004 become the relatively large roughness surfaces 1202 and 1203, the areas of the rough surfaces 1202 and 1203 are larger than the areas of the flat surfaces 1003 and 1004. In other words, the density of the conductive residue 1002 on the rough surfaces 1202 and 1203 is smaller than the density of the conductive residue 1002 on the flat surfaces 1003 and 1004. Therefore, the second plasma treatment is easier to remove the conductive residue 1002 on the rough surfaces 1202 and 1203 than the conductive residue 1002 on the flat surfaces 1003 and 1004. According to some embodiments, the nitrogen may remove most of the conductive residue 1002 on the processed portions (i.e. the rough surfaces 1202 and 1203) of the first insulating layer 401.

Figure 13:
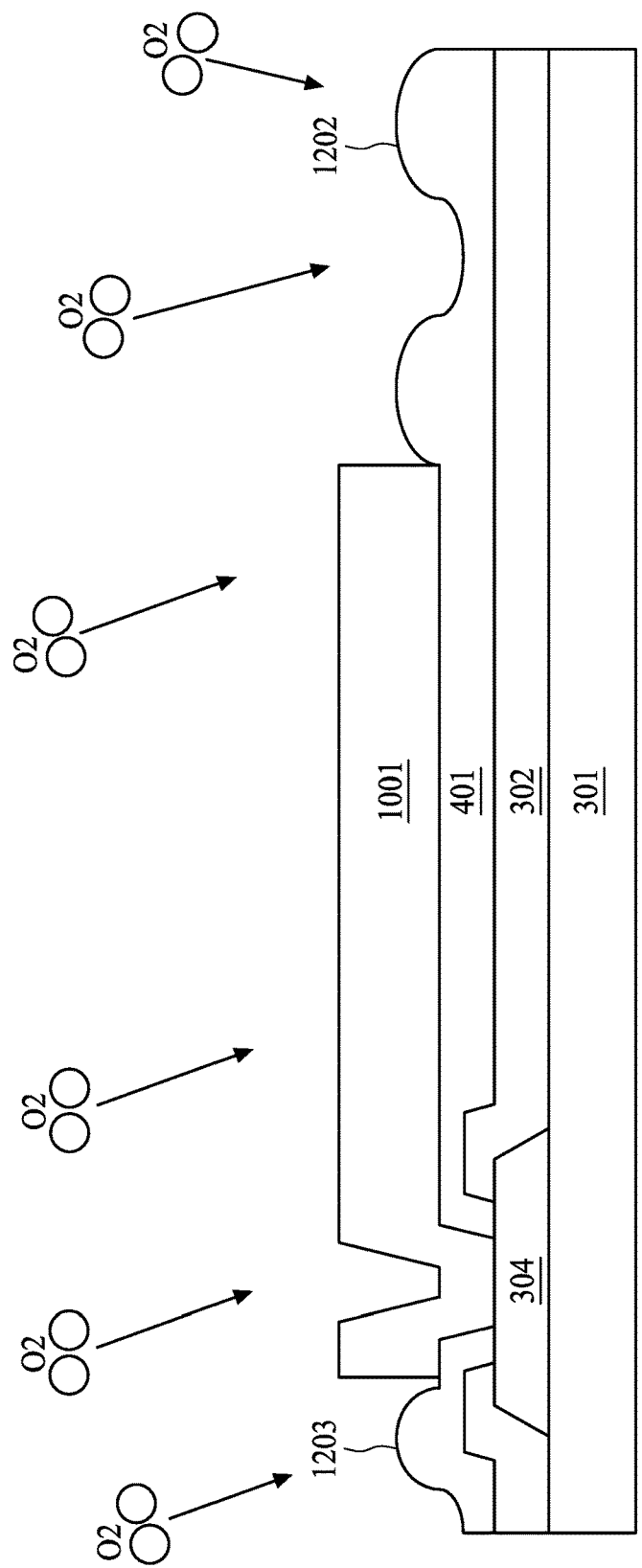

Referring to FIG. 2 and FIG. 13, in operation 211, the third plasma treatment is performed upon the first insulating layer 401 and the redistribution layer 1001. The third plasma treatment is performed following the second plasma treatment. The third plasma treatment is designed to have a third reactive rate to process the first insulating layer 401. The third reactive rate may be depended on the concentration of plasma used in the third plasma treatment, the temperature during the third plasma treatment, or a combination of the above conditions. According to some embodiments, the third plasma treatment is a surface treatment by using oxygen (O2) gas or plasma. The oxygen is arranged to react with the rest of the conductive residue 1002 on the rough surfaces 1202 and 1203 of the first insulating layer 401 for removing the conductive residue 1002 from the first insulating layer 401. According to some embodiments, the oxygen does not further deform the rough surfaces 1202 and 1203 of the first insulating layer 401 during the third plasma treatment because the treatment time or duration of the third plasma treatment is controlled to be shorter than the treatment time of the first plasma treatment. For example, the treatment time of the third plasma treatment may be a third of the treatment time of the first plasma treatment. Moreover, the third reactive rate of the third plasma treatment is smaller than the second reactive rate of the second plasma treatment. After the third plasma treatment, the conductive residue 1002 can be substantially removed from the processed portions (i.e. the rough surfaces 1202 and 1203) of the first insulating layer 401.

After the operations 209-211 of the method 200, most of the residues on the rough surfaces 1202 and 1203 are removed. However, there may still have some residues left on the rough surfaces 1202 and 1203 after the operations 209-211. According to some embodiments, when the material of the conductive layer 801 is copper-titanium alloy, after the operations 209-211, the percentage of the residue of copper left on the rough surfaces 1202 and 1203 of the first insulating layer 401 may be less than 2%, and the percentage of the residue of titanium left on the rough surfaces 1202 and 1203 of the first insulating layer 401 may be less than 0.2%.

Figure 14:
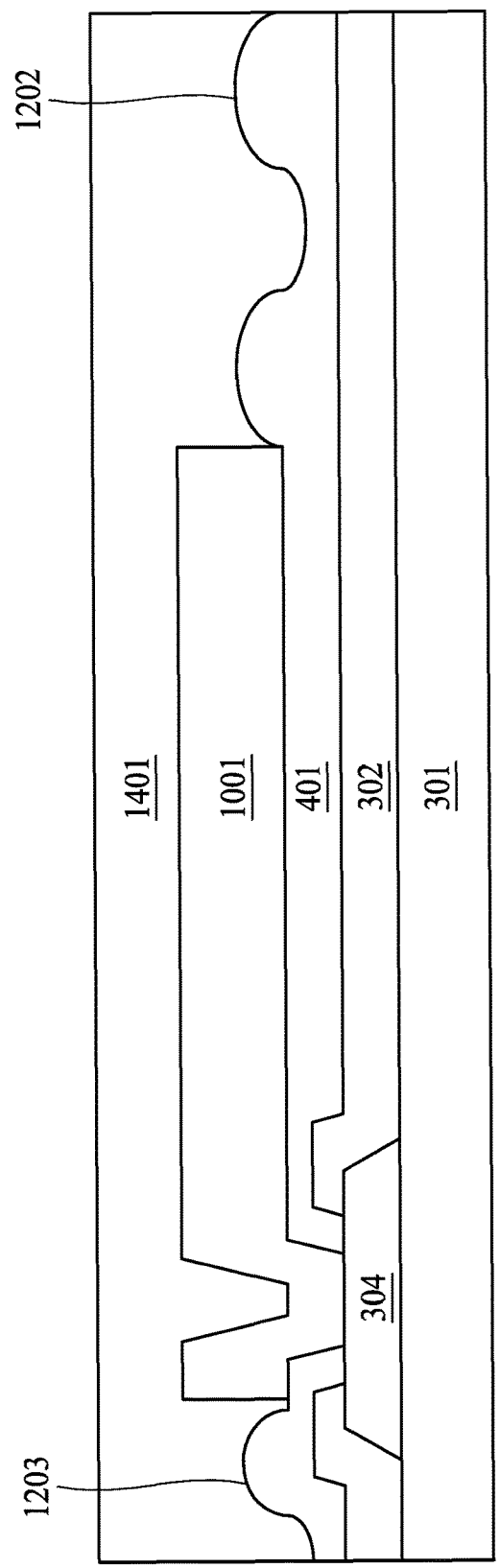

Referring to FIG. 2 and FIG. 14, in operation 212, a second insulating layer 1401 is formed on the redistribution layer 1001 and the rough surfaces 1202, 1203 of the first insulating layer 401. The second insulating layer 1401 may be a polymer layer or a dielectric layer. The second insulating layer 1401 is made by any suitable technique such as spin coating.

Figure 15:
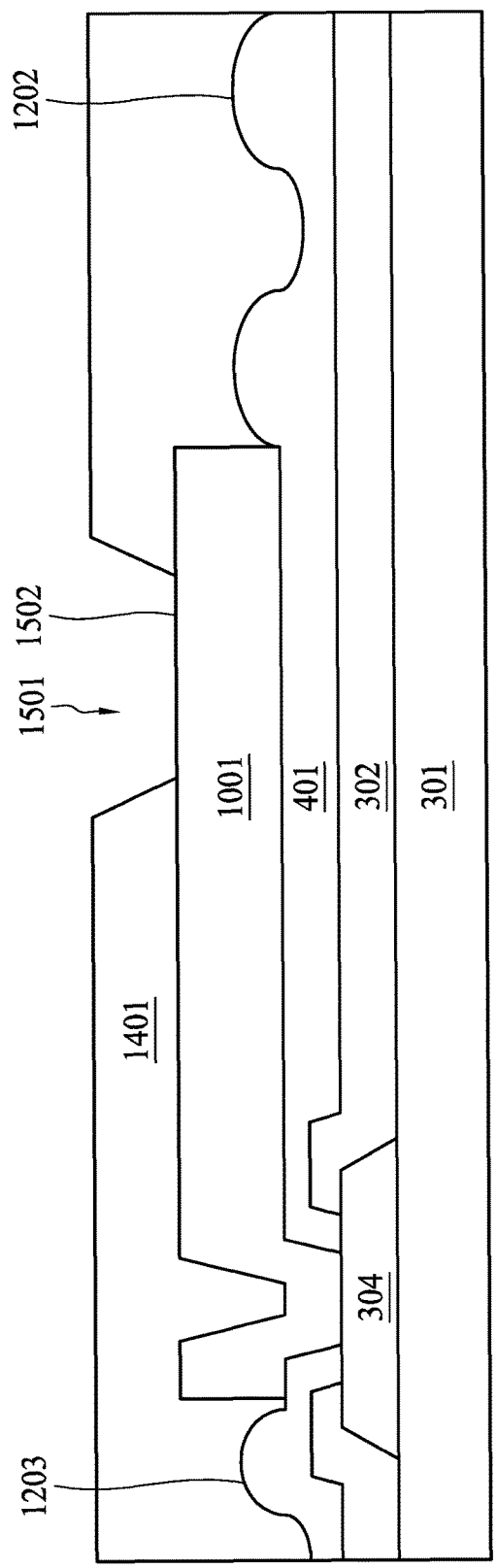

Referring to FIG. 2 and FIG. 15, in operation 213, the second insulating layer 1401 is patterned to form an opening 1501 to expose a surface 1502 of a portion of the redistribution layer 1001. In some embodiments, a mask may be used for transferring a pattern on the second insulating layer 1401. A lithography operation is combined therewith to form the opening 1501.

Figure 16:
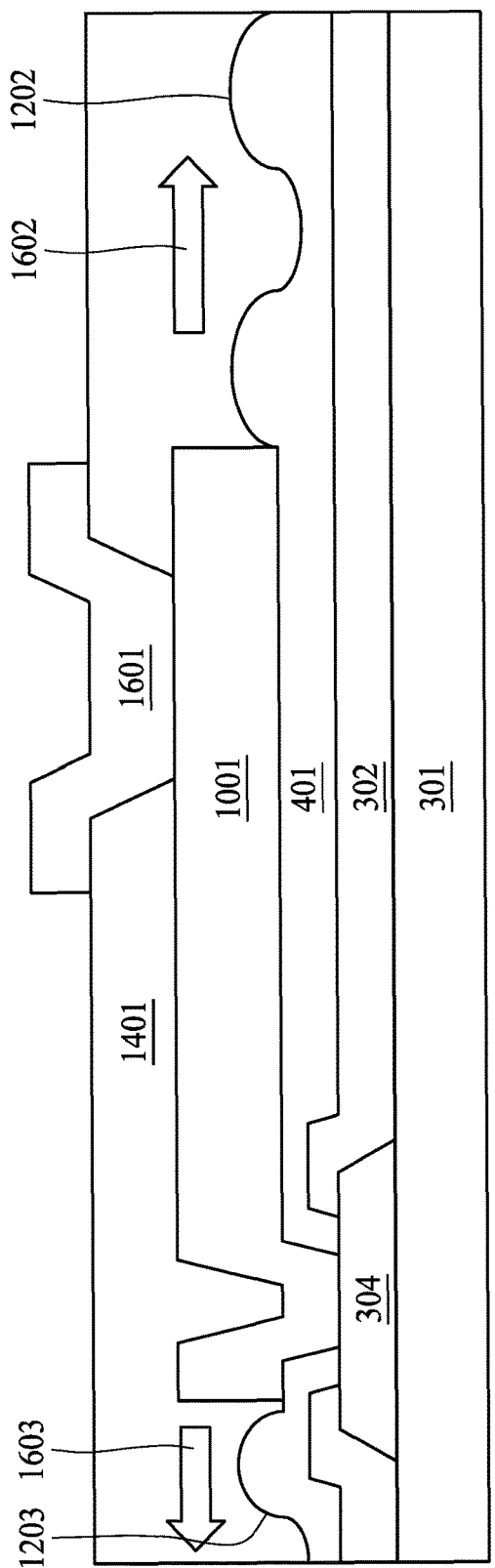

Referring to FIG. 2 and FIG. 16, in operation 214, the underbump metallization 1601 is formed on the exposed portion of the redistribution layer 1001 (i.e. the opening 1501) and a portion of the second insulating layer 1401 for receiving a metal bump (not shown).

According to the operations 201-214, the semiconductor structure 100 is fabricated. In the semiconductor structure 100, the second insulating layer 1401 is disposed on the clean (i.e. no conductive residue 1002) and rough surfaces 1202, 1203 of the first insulating layer 401. Accordingly, the second insulating layer 1401 can be tightly adhered to the rough surfaces 1202, 1203 of the first insulating layer 401. When the semiconductor structure 100 is processed under a heating process, the first insulating layer 401 and the second insulating layer 1401 may undergo thermal stress (i.e. the arrows 1602 and 1603) due to the thermal expansion. The rough surfaces 1202, 1203 of the first insulating layer 401 are acted as a fastener to force the first insulating layer 401 and the second insulating layer 1401 to have the same expansion distance when the semiconductor structure 100 is heated during the heating process. As described in above paragraphs, when the first insulating layer 401 and the second insulating layer 1401 have the same expansion distance during the heating process, the interface between the second insulating layer 1401 and the underbump metallization 1601, the interface between the second insulating layer 1401 and the redistribution layer 1001, and the interface between the second insulating layer 1401 and the first insulating layer 401 may not be delaminated, and the moisture is prevented from reaching the redistribution layer 1001. Therefore, the moisture incursion problem in the semiconductor structure 100 is improved.

In some embodiments, a method of fabricating a semiconductor structure is provided. The method comprises: forming a conductive layer on a first insulating layer; etching a portion of the conductive layer to expose a portion of the first insulating layer; deforming a surface of the portion of the first insulating layer to form a rough surface of the first insulating layer; and removing a residue of the conductive layer on the rough surface of the first insulating layer.

In some embodiments, a method of fabricating a semiconductor structure is provided. The method comprises: forming a first insulating layer having an opening exposing a conductive pad; forming a conductive layer on the conductive pad and the first insulating layer; etching a portion of the conductive layer to expose a portion of the first insulating layer; performing a first oxygen plasma treatment upon the portion of the first insulating layer to form a first processed portion of the first insulating layer; performing a nitrogen plasma treatment upon the processed portion of the first insulating layer to form a second processed portion of the first insulating layer; and forming a second insulating layer on the conductive layer and the first insulating layer.

In some embodiments, a semiconductor structure is provided. The semiconductor structure comprises a conductive pad, a first insulating layer, a conductive layer, and a second insulating layer. The first insulating layer is disposed on the conductive pad and arranged to have a first opening for exposing a surface of a portion of the conductive pad. The conductive layer is disposed on the surface of the portion of the conductive pad and a first surface of the first insulating layer, wherein a second surface of the first insulating layer is not disposed by the conductive layer. The second insulating layer is disposed on the conductive layer and the second surface of the first insulating layer, wherein a percentage of titanium on the second surface of the conductive layer is about 0.02%~about 0.20%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor structure, comprising:
   forming a conductive layer on a first insulating layer;
   etching a portion of the conductive layer to expose a portion of the first insulating layer;
   deforming a surface of the portion of the first insulating layer to form a rough surface of the first insulating layer; and
   removing a residue of the conductive layer from the rough surface of the first insulating layer.

2. The method of claim 1, further comprising:
disposing a second insulating layer on the conductive layer and the rough surface of the first insulating layer.

3. The method of claim 1, wherein deforming the surface of the portion of the first insulating layer to form the rough surface of the first insulating layer comprises:
performing a first plasma treatment upon the surface of the portion of the first insulating layer to form the rough surface of the first insulating layer.

4. The method of claim 3, wherein the first plasma treatment is an oxygen plasma treatment.

5. The method of claim 2, wherein removing the residue of the conductive layer on the rough surface of the first insulating layer comprises:
performing a second plasma treatment upon the rough surface of the first insulating layer surface to remove the residue of the conductive layer; and
performing a third plasma treatment upon the rough surface of the first insulating layer to further remove the residue of the conductive layer after the second plasma treatment; wherein the second plasma treatment is different form the first plasma treatment, and the third plasma treatment is different form the second plasma treatment.

6. The method of claim 5, wherein the second plasma treatment is a nitrogen plasma treatment, and the third plasma treatment is an oxygen plasma treatment.

7. The method of claim 5, wherein a treatment time of the first plasma treatment performing upon the portion of the first insulating layer is longer than the treatment time of the third plasma treatment performing upon the rough surface of the first insulating layer.

8. A method of fabricating a semiconductor structure, comprising:
forming a first insulating layer having an opening exposing a conductive pad;
forming a conductive layer on the conductive pad and the first insulating layer;
etching a portion of the conductive layer to expose a portion of the first insulating layer;
performing a first oxygen plasma treatment upon the portion of the first insulating layer to form a first processed portion of the first insulating layer;
performing a nitrogen plasma treatment upon the processed portion of the first insulating layer to form a second processed portion of the first insulating layer; and
forming a second insulating layer on the conductive layer and the first insulating layer.

9. The method of claim 8, wherein the conductive layer comprises one or more materials selected from the group consisting copper, titanium, and combinations thereof.

10. The method of claim 8, further comprising:
performing a second oxygen plasma treatment upon the second processed portion of the first insulating layer portion of the first insulating layer to form a third processed portion of the first insulating layer.

11. The method of claim 10, wherein a treatment time of the first oxygen plasma treatment performing upon the portion of the first insulating layer is longer than the treatment time of the second oxygen plasma treatment performing upon the second processed portion of the first insulating layer.

12. A method of fabricating a semiconductor structure, comprising:
forming a conductive pad on an integrated circuit;
forming a first insulating layer over the conductive pad, the first insulating layer having a first portion and a second portion, wherein a roughness of a surface of the second portion is different from a roughness of a surface of the first portion;
forming a conductive layer on the first portion of the first insulating layer and the conductive pad;
removing a residue of the conductive layer left on the surface of the second portion; and
forming an underbump metallization on the conductive layer.

13. The method of claim 12, wherein the roughness of the surface of the second portion is rougher than the roughness of the surface of the first portion.

14. The method of claim 12, further comprising:
forming a second insulating layer on the second portion of the first insulating layer.

15. The method of claim 14, further comprising:
forming the second insulating layer on the conductive layer.

16. The method of claim 15, wherein the first insulating layer and the second insulating are polymer layers.

17. The method of claim 12, wherein the roughness of the surface of the second portion is about 8~15 nm.

18. The method of claim 12, wherein a roughness of a surface of the conductive layer is about 25~40 um.

19. The method of claim 12, wherein the conductive layer comprises one or more materials selected from the group consisting copper, titanium, and combinations thereof.

20. The method of claim 12, wherein removing the residue of the conductive layer on the surface of the second portion comprises:
performing a plasma treatment upon the conductive layer and the surface of the second portion of the first insulating layer.

* * * * *